(12) United States Patent
Abramovici et al.

(10) Patent No.: US 6,202,182 B1
(45) Date of Patent: Mar. 13, 2001

(54) METHOD AND APPARATUS FOR TESTING FIELD PROGRAMMABLE GATE ARRAYS

(75) Inventors: Miron Abramovici, Berkeley Heights, NJ (US); Charles Eugene Stroud; Sajitha S. Wijesuriya, both of Lexington, KY (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/109,123

(22) Filed: Jun. 30, 1998

(51) Int. Cl.$^7$ .................................................. G01R 31/28
(52) U.S. Cl. .............................................................. 714/725
(58) Field of Search .................................... 714/725, 728, 714/733, 734, 738, 726; 326/38–41; 324/765

(56) References Cited

U.S. PATENT DOCUMENTS

| | | |
|---|---|---|
| Re. 34,445 | 11/1993 | Hayes et al. . |
| 4,414,669 | 11/1983 | Heckelman et al. . |
| 4,757,503 | 7/1988 | Hayes et al. . |
| 4,817,093 | 3/1989 | Jacobs . |
| 5,051,996 | 9/1991 | Bergeson et al. . |
| 5,081,297 | 1/1992 | Lebel et al. . |
| 5,090,015 | 2/1992 | Dabbish et al. . |
| 5,107,208 | 4/1992 | Lee . |
| 5,179,561 | 1/1993 | Izawa et al. . |
| 5,260,946 | 11/1993 | Nunally . |
| 5,278,841 | 1/1994 | Myers . |
| 5,347,519 | 9/1994 | Cooke et al. . |
| 5,361,264 | 11/1994 | Lewis . |
| 5,425,036 | 6/1995 | Liu et al. . |
| 5,430,734 | 7/1995 | Gilson . |
| 5,475,624 | 12/1995 | West . |
| 5,488,612 * | 1/1996 | Heybruck ............................ 714/725 |
| 5,508,636 | 4/1996 | Mange et al. . |
| 5,623,501 | 4/1997 | Cooke et al. . |
| 5,867,507 * | 2/1999 | Beebe et al. ......................... 714/726 |

OTHER PUBLICATIONS

G. Gibson Et Al., "Boundary–Scan Access Of Built In Self Test For Programmabl Gate Arrays," Proc. IEEE International ASIC Conf. pp. 57–61, Sep. 7–10, 1997.
A. Hassan Et Al., "Testing And Diagnosis Of Interconnects Using Boundary Scan Architecture," Proc. IEEE International Test Conf. PP 126–137, Sep. 12–14, 1998.
W.K. Huang Et Al., "An Approach To Testing Programmable/Configurable Field Programmable Gate Arrays," Proc. IEEE VLSI Test Symp pp. 450–455, Apr. 28–May 5, 1996.
T. Liu Et Al., "Diagnosis Of Interconnects And FPICS Using A Structured Walking–1 Approach," Proc. IEEE VLSI Symp, pp. 256–261, Apr.30–May 3, 1995.
F. Lombardi Et Al., "Diagnosing Programmable Interconnect Systems For FPGAS," Proc ACM/SIGDA Internationl Symp On FPGA, PP 100–106, 1996.

(List continued on next page.)

*Primary Examiner*—Albert De Cady
*Assistant Examiner*—Shelly A Chase
(74) *Attorney, Agent, or Firm*—King & Schickli PLLC (57) ABSTRACT

A method of built-in self-testing field programmable gate arrays (FPGAs) including the programmable logic blocks, the programmable routing networks and the programmable input/output cells or boundary ports at the device, board or system level includes testing the programmable logic blocks, reconfiguring a first group of he programmable logic blocks to include a test pattern generator and an output response analyzer, and configuring the programmable routing network into groups of wires under test. This step is followed by generating test patterns propagated along the wires under test and comparing the outputs utilizing the output response analyzer. Based on the result of the comparison a pass/fail test result indication is routed to the associated boundary port. The results from a plurality of output response analyzers can be compared utilizing an iterative comparator in order to reduce the number of boundary ports required during testing.

21 Claims, 7 Drawing Sheets

OTHER PUBLICATIONS

C. Stroud Et Al., "Evalution Of FPGA Resources For Built In Self Test Of Programmable Blocks," Proc ACM/SIGDA Inter. Symp. On FPGAS PP 107–113, 1996.

C. Stoud Et Al., "Built In Self Test For Programmable Logis Blocks In FPGA,"Proc IEEE VLSI Test Symp, PP 387–392, Apr. 28–May 1, 1996.

C. Stroud Et Al., "Using ILA Testing For Bist In FPGAS," Proc IEEE International Test Conf., PP 68–75, Oct. 20–25, 1996.

C. Stroud Et Al., "Bist Based Diagnostics For FPGA Logic Blocks," Proc. IEEE International Test Conf., PP 539–547, Nov. 1–6, 1997.

* cited by examiner

METHOD AND APPARATUS FOR TESTING FIELD PROGRAMMABLE GATE ARRAYS

TECHNICAL FIELD

The present invention relates generally to the field of testing of integrated circuit devices and, more particularly, to a method of testing field programmable gate arrays.

BACKGROUND OF THE INVENTION

A field programmable gate array (FPGA) is a type of integrated circuit consisting of an array of programmable logic blocks (PLBS) interconnected by a programmable routing network and programmable input/output cells. Programming of the logic blocks, the routing network and the input/output cells or boundary ports is selectively completed to make the necessary interconnections that establish one configuration thereof to provide the desired system operation/function for a particular application The present inventors have recently developed methods of built-in self-testing the array of PLBs in FPGAs at the device, board and system levels. These methods are set out in detail in U.S. Pat. No. 5,998,907 and U.S. Pat. No. 6,003,150. The fill disclosures in these patent applications are incorporated herein by reference.

In each of these prior methods, the reprogrammability of an FPGA is exploited so that the FPGA is configured exclusively with built-in self-test (BIST) logic during testing and subsequently reconfigured to its normal operating configuration. In this way, testability at every level is achieved without overhead. In other words, the BIST logic simply "disappears" when the FPGA is reconfigured for its normal system function. The only cost or additional hardware required for these testing methods is memory for storing the BIST configuration data required for testing and the normal operating configuration required for subsequently reconfiguring the FPGA. This additional memory, however, may be made a part of the test machine environment, e.g., automatic testing equipment, a central processing unit or a maintenance processor, thereby not involving FPGA resources.

In addition to testing the array of PLBs, complete FPGA testing further requires the testing of the programmable routing network. Heretofore, testing of the programmable routing network was accomplished utilizing externally applied test vectors. While the use of test vectors is effective in testing of the programmable routing network, these tests are applicable only for specific device-level manufacturing tests. Accordingly, a need is identified for testing the entire programmable routing network at the device, circuit board and system levels.

SUMMARY OF THE INVENTION

An important aspect of the present invention is to provide methods of built-in self-testing FPGAs including the PLBs and the programmable routing network to achieve a complete test at the device, board or system levels. These methods not only test the global routing network which interconnects the array of PLBs but also the local routing network which brings signals into and out of the individual PLBs within the array.

In accordance with the of the present invention, a method is provided for built-in self-testing a programmable routing network of a field programmable gate array (FPGA). The method may be broadly defined as configuring a first group of programmable logic blocks (PLBs) of the FPGA under test to include at least one test pattern generator (TPG) and at least one output response analyzer (ORA), and further configuring a subset of the programmable routing network into at least two groups of wires under test (WUTs). Upon initiation of the built-in self-test (BIST), the at least one TPG generates test patterns which propagate along the at least two groups of WUTs. The outputs of the at least two groups of WUTs are compared utilizing the at least one ORA which in turn generates a test result indication.

More specifically, the FPGA under test is configured in accordance with a BIST configuration retrieved from memory. Preferably, the BIST configured FPGA includes a first group of PLBs configured as at least one TPG for generating test patterns and at least one ORA for receiving and comparing the test patterns, and at least two groups of WUTs along which the test patterns are propagated.

In accordance with an important aspect of the present invention, and in order to achieve a complete BIST of the programmable routing network of the FPGA under test, the WUTs include wire segments interconnected by configurable interconnect points (CIPs) and a second group of PLBs. There are two basic types of CIPs, including crosspoint and break-point, and each generally comprises a transmission gate controlled by a configuration memory bit. When incorporated into the WUTs, the second group of PLBs is specifically configured to allow the propagating test patterns to pass there through without alteration. Advantageously, this allows both the global routing network of the programmable routing network including the CIPs and the local routing structures leading to the PLBs to be tested.

In addition, the BIST configured FPGA may also include PLBs from the first group of PLBs configured to align one of the test patterns propagating along one of the at least two groups of WUTs prior to comparison by the ORA. More specifically, these PLBs are configured as swapper cells which map input test patterns to output test patterns. The need for alignment of one of the test patterns arises from the nature of the logic equations implemented in look-up tables (LUTs) of the ORA, the limitations on the inputs to the PLBs implementing the ORA, and the bus rotations in the WUTs.

Upon receipt of the test patterns, the at least one ORA generates a test result indication based on the outcome of the step of comparing outputs of the at least two groups of WUTs. A passing test result indication is generated if the corresponding test patterns are found to be the same upon reaching the at least one ORA. In the alternative, a failing test result indication is generated if the test patterns are not found to be the same. Such a failing test result indication may be caused by a fault in a wire segment, a CIP or a PLB of the at least two groups of WUTs.

One limitation of this type of comparison-based response analysis is the potential for equivalent faults in the outputs of the at least two groups of WUTs. Equivalent faults along the at least two groups of WUTs result in passing test result indications even though faults exist. Advantageously, to overcome this limitation the method of the present invention further includes the step of comparing the output or value transmitted along the first group of WUTs to the output or value transmitted along the second group of WUTs and the output or value transmitted along a third group of neighboring WUTs. This type of multiple testing substantially eliminates the potential for equivalent faults.

Additionally, in order to maintain a low number of reconfigurations of the FPGA under test and a short total testing time during the BIST, parallel testing is utilized. More specifically, the test result indications of several ORAs can be combined utilizing an iterative comparator. Alternatively, the test result indication generated by the at least one ORA can be routed directly to a boundary port of the FPGA under test. Advantageously, this provides information regarding the location of the fault in the FPGA under test, as opposed to the single pass/fail test result indication for the entire test.

BRIEF DESCRIPTION OF THE DRAWING

The accompanying drawing incorporated in and forming a part of the specification, illustrates several aspects of the present invention and together with the description serves to explain the principles of the invention. In the drawing.

Reference will now be made in detail to the present preferred embodiment of the invention, an example of which is illustrated in the accompanying drawing.

DETAILED DESCRIPTION OF THE INVENTION

Figure 6:
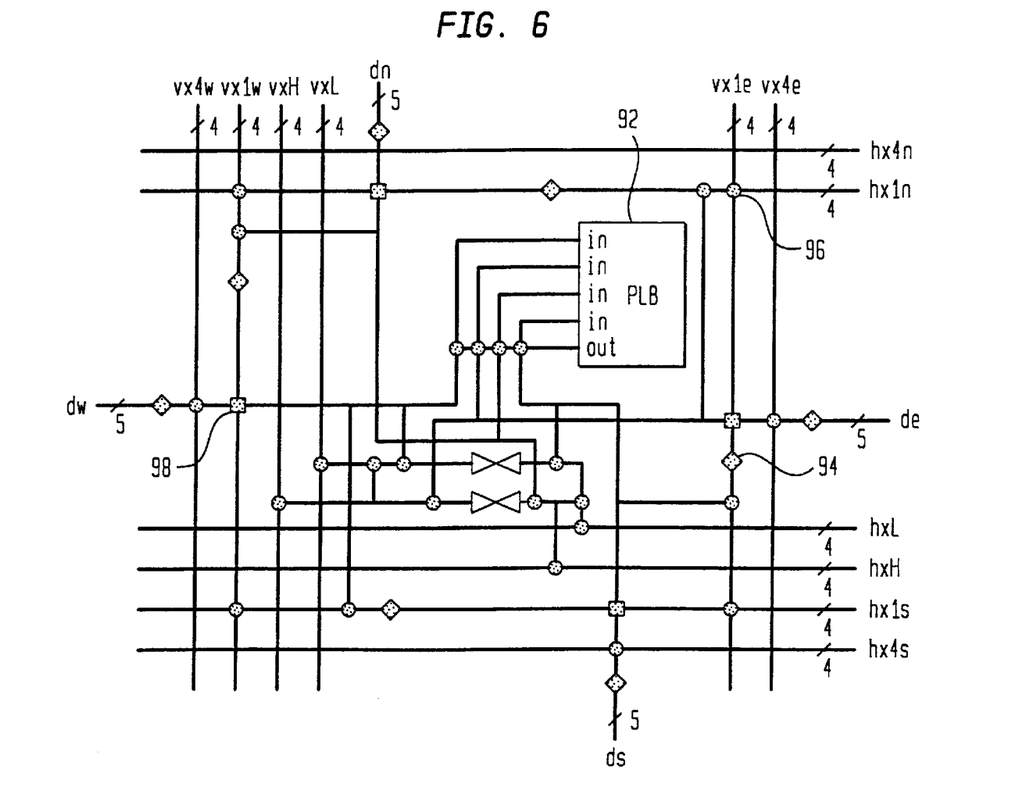
FIG. 6 is a typical wiring schematic of the global and local programmable routing networks associated with a single programmable logic block.

A typical field programmable gate array (FPGA) generally consists of an array of programmable logic blocks (PLBs) interconnected by a programmable routing network and programmable input/output (I/O) cells or boundary ports. Such structures are, for example, featured in the Lucent ORCA programmable function unit, in the Xilinx XC4000 configurable logic block and in the ALTERA FLEX 8000 logic element. The programmable routing network of the typical FPGA comprises both a global routing network for carrying signals amongst the array of PLBs and the boundary ports, and local routing networks for carrying signals into and out of the PLBs. The typical global and local routing networks associated with a single PLB are shown in FIG. 6 and are discussed in more detail below.

Figure 1:
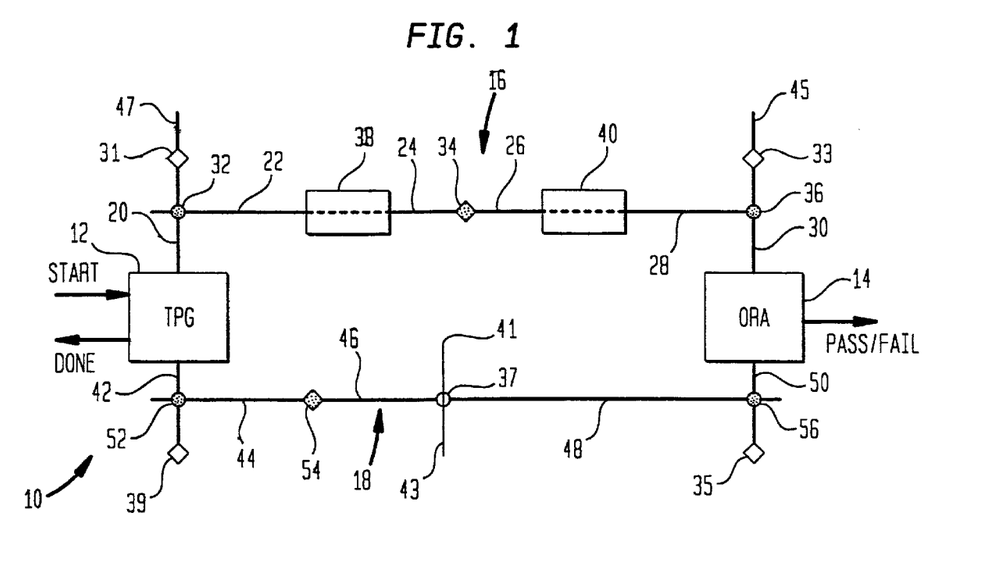
FIG. 1 is a schematical block diagram showing a basic built-in self-test structure.

FIG. 1 shows the preferred basic built-in self-test (BIST) architecture 10 utilized in carrying out the method of the present invention to test the programmable routing network of a typical FPGA. In accordance with the first step of the inventive method, a first group of programmable logic blocks of the FPGA under test are configured in accordance with a BIST configuration retrieved from memory located in automatic testing equipment, a central processing unit or a maintenance processing, for example. The BIST configured FPGA includes at least one test pattern generator (TPG) 12 and at least one output response analyzer (ORA) 14. In addition, a subset of the programmable routing network of the FPGA under test is configured to include at least two groups of wires under test (WUTs) 16, 18.

In the preferred basic BIST architecture 10, the first group of WUTs 16 includes a group of wire segments 20, 22, 24, 26, 28 and 30, a group of configurable or configuration interconnect points (CIPs) 32, 34 and 36, and a second group of PLBs 38, 40. Similarly, the second group of WUTs 18 includes wire segments 42, 44, 46, 48 and 50 and CIPs 52, 54 and 56.

As shown in FIG. 1, the groups of WUTs 16, 18 connect TPG 12 and ORA 14. Upon initiation of the BIST and in accordance with another step of the inventive method, the at least one TPG 12 generates identical test patterns which propagate along the WUTs 16, 18. The test patterns are received by the at least one ORA 14 and are compared to determine whether a fault exists within the WUTs. Based on the outcome of the comparing step of the method, a test result indication is generated by the at least one ORA 14 and routed to a boundary port of the FPGA. Advantageously, this allows information regarding the location of the fault to be obtained.

More specifically, the test patterns generated by the TPG 12 must detect all shorts among the WUTs 16, 18 and all stuck-open faults for the closed CIPs (e.g. 32, 34, 36, 52, 54 and 56) along the WUTs. In addition, the open CIPs (e.g. 31, 33, 35, 37 and 39) which isolate the WUTs 16, 18 from the rest of the programmable interconnect network must be tested for stuck-closed faults. To accomplish this result, the TPG 12 should also control any wire segment (e.g. 41, 43, 45 and 47) that could become shorted to a WUT. For example, when the TPG drives a 0(1) test pattern along the WUTs a contrary test pattern or a 1(0) test pattern should be propagated along wire segments 41, 43, 45 and 47 at least once during the test. A more detailed discussion of the fault model utilized in carrying out the method of the present invention, as well as an example BIST are provided below.

Figure 2A:
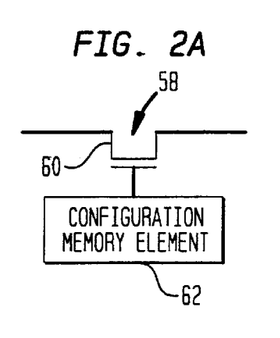
FIG. 2A is a schematical illustration showing a typical configuration interconnect point of a field programmable gate array.
Figure 2B:
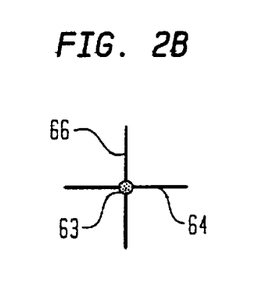
FIG. 2B is a schematical illustration of a cross-point configuration interconnect point of a typical field programmable gate array.
Figure 2C:
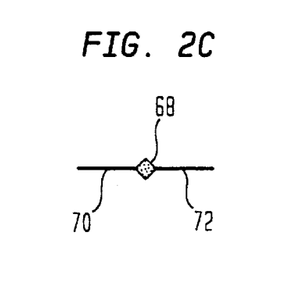
FIG. 2C is a schematical illustration of a break-point configuration interconnect point of a typical field programmable gate array.

In order to fully appreciate the above described method of the present invention, a detailed description of the components utilized in the preferred basic BIST architecture 10 is required. As best shown in FIG. 2A, a typical CIP 58 or switch comprises a transmission gate 60 controlled by a configuration memory bit 62. There are two basic types of CIPs including cross point CIPs 63 (shown throughout the drawing figures by a circle-shaped symbol) for connecting wire segments (e.g. reference numerals 64 and 66 in FIG. 2B) located in disjoint planes and break-point CIPs 68 (shown throughout the drawing figures by a diamond-shaped symbol) for connecting wire segments (e.g. reference numerals 70 and 72 in FIG. 2C) in the same plane.

Figure 3:
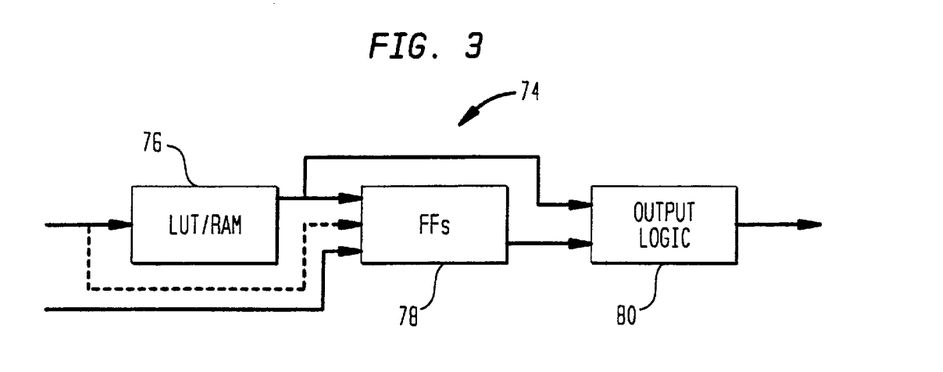
FIG. 3 is a schematical illustration of a typical programmable logic block of a field programmable gate array.

As shown in FIG. 3, a typical PLB 74 comprises a memory block 76, a flip-flop block 78 and a combinational output logic block 80. The memory block 76 may be configured as random access memory or as a combination look-up table (LUT). The flip flops in the flip flop block 78 may also be configured as latches although other programming options dealing with synchronous and asynchronous Set and Reset, Clock Enable, etc. could be provided. The output logic block 80 typically contains a multiplexer in order to connect different wire segments to the output of the PLB 74. Usually this cell has no feed back loops and the flip flops can be directly accessed by bypassing the LUT (shown in dashed line in FIG. 3). Advantageously, the inputs and outputs of every subcircuit in this type of simple structure are easy to control and observe.

As noted above, the preferred basic BIST architecture typically includes a second group of PLBs. In particular and as further shown in FIG. 1, the wire segments of the WUTs 16, 18 are connected to the inputs 22, 26 and outputs 24, 28 respectively of the PLBs 38, 40 of the second group of PLBs. In accordance with one advantage of the present invention, the second group of PLBs are configured as identity functions in order to pass the test patterns from input to output. This allows for built-in self-testing of the local programmable routing networks, as well as, the global routing network.

Figure 4:
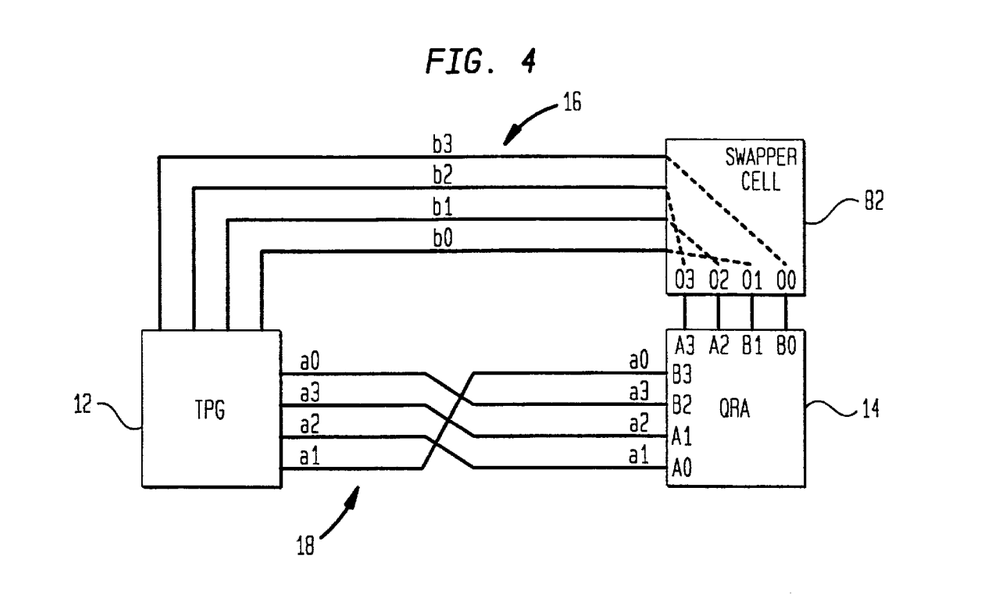
FIG. 4 is a schematical block diagram showing a basic built-in self-test structure including a swapper cell as utilized in the present invention to align the test patterns prior to their comparison.

As shown in FIG. 4 and in accordance with the method of the present invention, the first group of PLBs are further configured to include a swapper cell 82. The swapper cell 82 aligns the test patterns generated by the TPG 12 prior to reaching the ORA 14. The need for the aligning step and the step of configuring the first group of PLBs into the swapper cell 82 arises due to the nature of the logic equations implemented in the LUTs of the ORA 14, limitations on the inputs to the PLBs implementing the ORA 14, and the bus rotations (shown in FIG. 4) in the WUTs 16, 18.

As further shown in FIG. 4, the swapper cell 82 (see dashed lines) is simply a combinational function programmed to map input test patterns to output test patterns to achieve the desired alignment for comparison by the ORA 14. More specifically, the test patterns propagating along WUT 18, and more specifically busses a1 and a2, are compared with the test patterns propagating along WUT 16 or busses b1 and b2 in the LUT fed by the PLB inputs A0–A3 while the test patterns of busses a0 and a3 of WUT 18 are compared with the test patterns of busses b0 and b3 of WUT 16 in the LUT fed by the PLB inputs B0–B3.

Unlike signature-based compression circuits used in most prior art BIST applications, comparison-based ORAs do not suffer from the aliasing problems that occur when some faulty circuits produce a good circuit signature. Essentially, as long as the WUTs being compared by the same ORA do not fail in the same way at the same time, no aliasing is encountered with the comparison-based approach of the method of the present invention. Of course, such an occurrence is highly unlikely.

Still in accordance with another step of the method of the present invention, potential problems caused by equivalent faults in the WUTs being compared are avoided by comparing the test pattern propagated along the first group of WUTs with the test patterns propagated along two different neighboring groups of WUTs. More specifically, the test pattern propagated along the first group of WUTs is first compared to the test pattern propagated along the second group of WUTs and subsequently to the test pattern propagated along a third, neighboring group of WUTs (not shown in FIG. 1). Advantageously, this secondary check substantially eliminates the potential problem of equivalent faults within two WUTs.

In accordance with the method of the present invention, a complete BIST of the array of PLBs in the FPGA will be run before the BIST of the programmable interconnect network. Since the PLB BIST is also using a large portion of the programmable interconnect, we examined the coverage provided by this testing in order to avoid duplicate testing. Rather than attempt to target the individual routing faults left undetected by the PLB test, it was decided that completely testing the programmable routing network is simpler and more efficient, even if some duplication occurs. As indicated above, the methods for testing the array of PLBs are set out in detail in pending U.S. Pat. No. 5,991,907 and U.S. Pat. No. 6,003,150.

Figure 5:
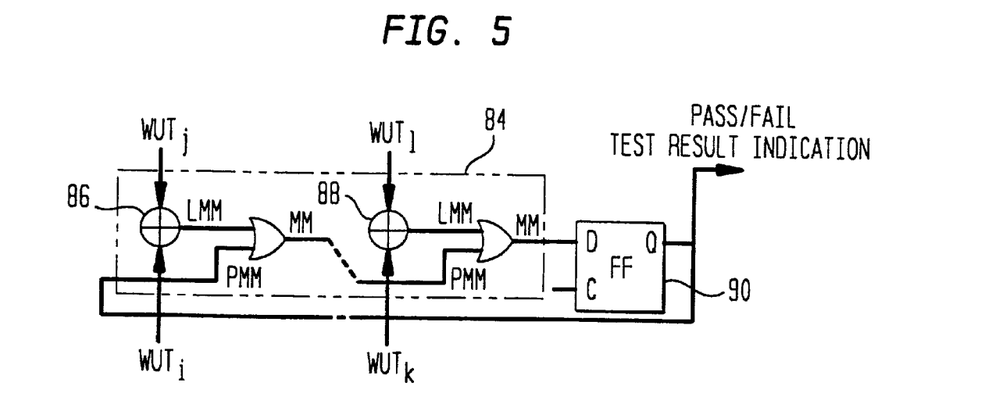
FIG. 5 is a schematical illustration of an iterative comparator with error locking as utilized in the present invention to combine the results of several output response analyzers.

In order to minimize the number of reconfigurations required during the built-in self-test, and therefore the total testing time, a great deal of parallel testing is required. This parallel testing of many groups of WUTs requires a large number of ORAs and boundary ports for receiving the associated test result or pass/fail indications. In order to combine the test result indications of several ORAs, an iterative comparator can be used. In particular, such an iterative comparator 84 may be based upon one proposed by Sridhar and Hayes in "Design of Easily Testable BIT-Sliced Systems", *IEEE Trans. on Computers*, Vol. C-30, No.11, pp. 842–54, November, 1981 as shown in the dashed lines in FIG. 5.

In accordance with the method of the present invention, each ORA 86, 88 compares the corresponding test patterns propagated along the WUTs (e.g. $WUT_i$, $WUT_j$ and $WUT_k$, $WUT_l$ in FIG. 5) to produce a test result indication or a local mismatch signal (LMM) The iterative comparator 84 ORs the test result indication or previous mismatch signal (PMM) from the first ORA 86 to generate an ORA mismatch signal (MM). The flip-flop 90 is used to record the first mismatch encountered during the BIST sequence. The feedback from the flip-flop output to the first ORA 86 disables further comparisons after the first error is detected. Except for this feedback signal, all the other ORA signals propagate like in an iterative logic array, using only local routing resources.

Alternately, the various ORA outputs can be routed directly to the boundary ports to retrieve the results as indicated above. This provides more information regarding the location of the fault in the FPGA as opposed to a single pass/fail test indication for the entire test resulting from the use of an iterative comparator.

As indicated above, FIG. 6 illustrates a simplified view of the routing busses associated with a single PLB designated numeral 92 in an ORCA 2C series FPGA. Horizontal and vertical busses are denoted by h and v, respectively. The suffixes x1, x4, xH, and xL indicate wire segments that extend across 1 PLB, 4 PLBs, half the PLB array, and the full length of the PLB array, respectively, before encountering a break-point CIP or a boundary point of the FPGA (not shown). Direct busses provide connections between adjacent PLBs. The four direct busses are designated dn, ds, de, and dw denoting direct north, south, east, and west, respectively.

Figure 6A:
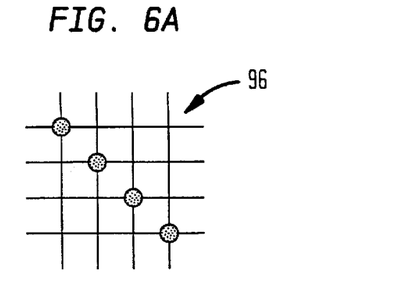
Figure 6B:
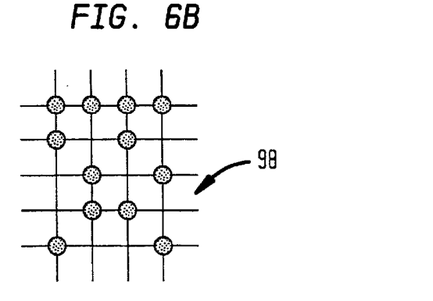

For every PLB there are two sets of vertical x1 busses and two sets of horizontal x1 busses, designated vx1w, vx1e, hx1n, and hx1s. Several CIPs are available to establish different connections among the wire segments as shown by circle and diamond-shaped symbols. The diamond-shaped symbol 94 of a break-point CIP on a 4-bit bus represents a group of 4 individual break-point CIPs. Similarly and as shown in FIG. 6A, a circle-shaped symbol 96 denoting a cross-point CIP at the intersection of a vertical 4-bit bus with an horizontal 4-bit bus represents a group of 4 individual cross-point CIPs between corresponding wires in the two busses. The square-shaped symbol 98, on the other hand, at the intersection of a 5-bit direct bus with a 4-bit x1 bus represents a more flexible matrix of cross-point CIPs shown in FIG. 6B.

The fault model utilized to test the programmable interconnect network of a typical FPGA in accordance with the method of the present invention, includes CIPs stuck-closed (stuck-on) and stuck-open (stuck-off), wire segments stuck at 0 or 1, open wire segments, and shorted wire segments. Detecting the CIP faults also detects stuck-at faults in the configuration memory bits that control the CIPs as shown generally in FIG. 2A. For generality, both wired-AND and wired-OR faults are considered as possible behavior for shorted wire segments. A stuck-closed CIP creates a short between its two wires.

Since detailed layout information regarding the adjacency relationships between wire segments is typically not available, only rough physical data available in FPGA data books, for example, is utilized to determine bunches of wire segments for testing. A bunch of wire segments is a group of wires that may have pair-wise shorts; but not every wire segment is necessarily adjacent to every other wire segment in the bunch. For example, all the vertical wire segments located between two adjacent PLB columns (partially shown in FIG. 6) may be treated as a bunch even if not all shorts are physically feasible. Advantageously, this makes the BIST method of the present invention layout-independent and allows the bus rotations which make the adjacency relations among the wire segments of the same bunch change to be ignored during testing.

In order to detect the routing faults mentioned briefly above, the applied BIST must verify that every wire segment and CIP is able to transmit both a 0 and a 1, and that every pair of wire segments that can be shorted can transmit both a (0, 1) and a (1, 0). Wire segments which can be shorted include vertical and horizontal segments separated by a cross-point CIP to account for the CIP being stuck-on. Applying walking patterns, i.e. walking a 1 through a field of 0s and a 0 through a field of 1s, to the at least two WUTs creates all the required test patterns.

An exhaustive set of test patterns produced by a counter will contain the set of walking test patterns as a subset. Either set detects all shorts between the WUTs. In the present preferred embodiment, a counter is utilized to generate exhaustive n-bit test patterns since the counter requires less PLBs than a generator for both n-bit walking patterns, provided that n is not too large. For a large n, the n WUTs may be divided into groups of k<n wire segments to which exhaustive test patterns are applied one group at a time while the other n-k wire segments are set to constant values. Eventually all required pairs of values are applied.

Figure 11:
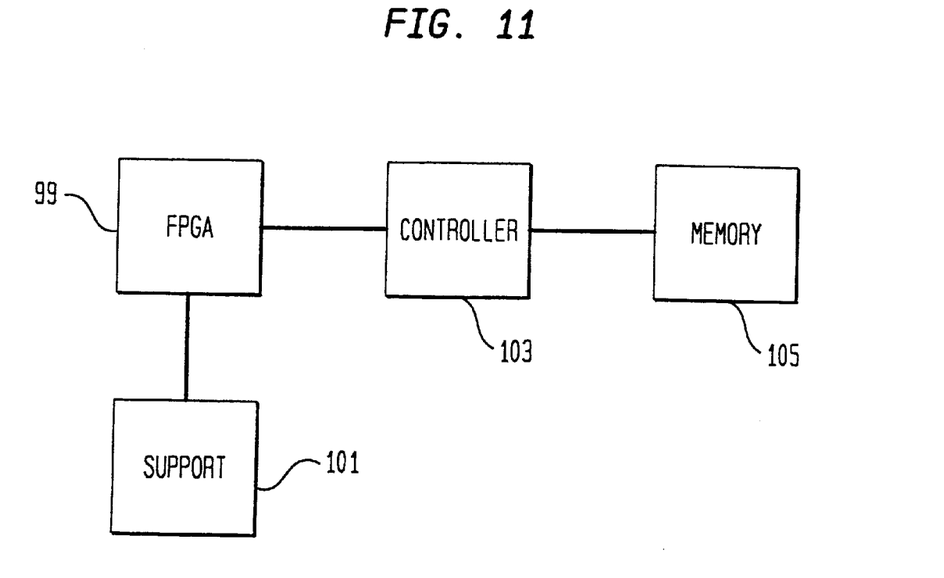
FIG. 11 is a schematic block diagram of an apparatus utilized to test an FPGA.

To perform the method of the present invention, an apparatus comprising a field programmable gate array 99, a support platform 101, a controller 103 and memory 105 may be utilized. In the preferred embodiment shown in FIG. 11, the FPGA is an in-circuit reprogrammable FPGA, such as an SRAM-based FPGA, which stores the configuration bits in SRAM and may be reconfigured an arbitrarily large number of times. In particular, the FPGA is configured to include at least one TPG, at least two groups of WUTs for propagating a test pattern, and at least one ORA for comparing the test patterns. By reconfiguring the FPGA, the programmable routing network can be exhaustively tested without dedicating any of circuitry for built-in self-testing. The support platform may include any necessary means (e.g. a circuit board or test bench) for testing the FPGA at the wafer, device, circuit board, or system levels. In addition, the test controller may be automated test equipment generally known in the art for testing wafers/devices, or a CPU or maintenance processor for board/system level testing. The memory should be sufficient to store the BIST configuration for the FPGA and the functional/operational configuration of the system in order to reconfigure the FPGA after BIST.

The following example is presented to further illustrate the present invention:

EXAMPLE

The present BIST-based diagnostic approach was utilized in the testing and diagnosis of the programmable interconnect network of an ORCA FPGA. The test consisted of four test sessions which included nineteen phases, summarized in Table 1 in terms of the target faults for each test session.

TABLE 1

Summary of BIST test sessions

| Session | Target Faults | Number of Phases | Refer to |
|---|---|---|---|
| 1 | shorts, opens, and some CIP faults in global busses | 8 | Figure 7, Table 2 |
| 2 | CIP faults in global busses | 2 | Figure 8 |
| 3 | CIP faults in direct busses | 5 | Figure 9 |
| 4 | faults in cross-point CIPs between global and direct busses | 4 | Figure 10 |

Figure 7A:
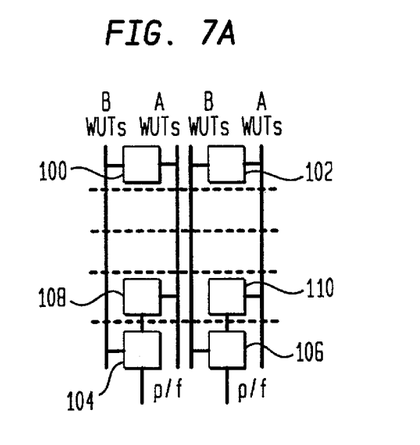
FIGS. 7A and 7B are schematical illustrations of the BIST architecture for testing the global busses in session 1 of the example BIST.
Figure 7B:
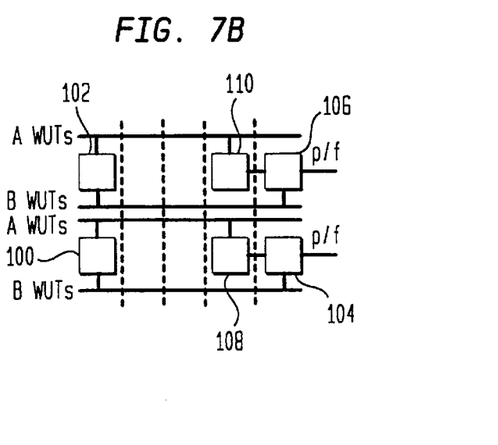

The first test session tests all the global interconnect network busses shown in FIG. 2 for shorts and opens. In addition, these configurations test all CIPs along the global busses, the break-point CIPs for stuck-off faults and the cross-point CIPs for stuck-on faults. The general BIST architecture for this set of tests is shown in FIGS. 7A and 7B. The dark lines represent the busses or wire segments under test.

An 8-bit exhaustive set of test patterns are generated and propagated along the A and B WUTs vertically while holding the remaining vertical busses, as well as, the horizontal busses (shown as dotted lines) at a constant logic value. The two PLBs 100, 102 are each configured as TPGs in the form of an 8-bit counter. Each TPG or counter generates and propagates a test pattern along a set of A WUTs and a set of B WUTs. PLBs 104, 106 are configured as two ORAs for comparing the test patterns propagated along the A WUTs and B WUTs driven by the same TPG. Additionally, PLBs 108, 110 are configured to align the test patterns or as swapper cells. Four different configurations are needed to test all the vertical busses as summarized in Table 2. As shown in FIG. 7B, the test layout is rotated by 90 degrees for testing the horizontal busses in the next four configurations.

TABLE 2

| | Global busses tested in Session 1 | | | | |
|---|---|---|---|---|---|
| | Vertical Phases | | Phase | Horizontal Phases | |
| Phase Number | A WUTs | B WUTs | Number | A WUTs | B WUTs |
| 1 | vx4e | vx4w | 5 | hx4n | hx4s |
| 2 | vx1w | vxH | 6 | hx1s | hxH |
| 3 | vxL | dn & ds | 7 | hxL | de & dw |
| 4 | dn & ds | vx1e | 8 | de & dw | hx1n |

Figure 8A:
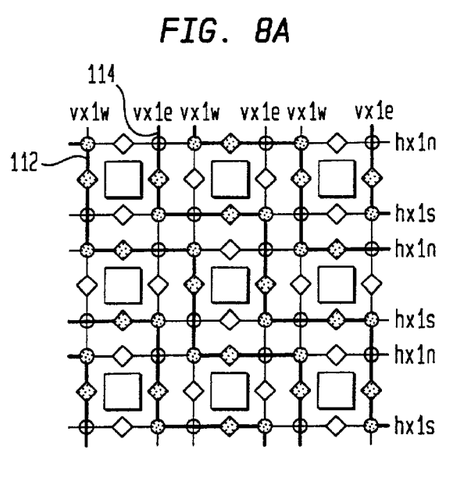
FIG. 8A is a schematical illustration of the staircase-type BIST architecture for testing the CIPs along the global busses in the w-to-n and e-to-s test phase of session 2 of the example BIST.
Figure 8B:
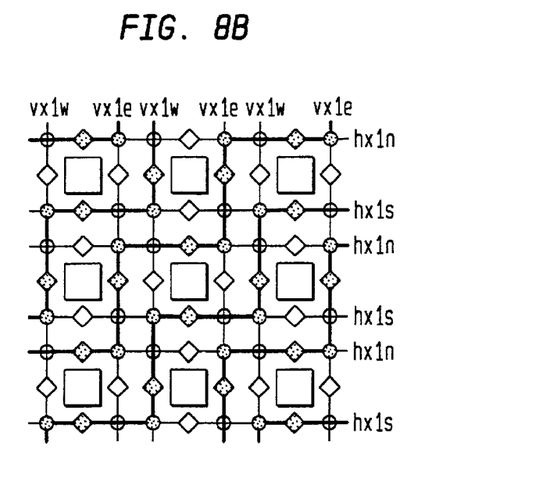
FIG. 8B is a schematical illustration of the staircase-type BIST architecture for testing the CIPs along the global busses in the e-to-n and w-to-s test phase of session 2 of the example BIST.

As shown in FIGS. 8A and 8B, the second session tests for stuck-on faults in the break-point CIPs and for stuck-off faults in some of the cross-point CIPs on the global busses. Each of the two staircase-type WUTs 112, 114 tests exactly half of the cross-point CIPs and half of the break-point CIPs on the x 1 global busses. The activated CIPs are shown as darkened circle-shaped and diamond-shaped symbols. The bold lines in FIGS. 8A and 8B indicate the connected wire segments of the programmable interconnect network during each of the two test phases.

As in the previous test session, a TPG configured as an 8-bit counter drives two adjacent sets of busses such that opposite values occur at the break-points which remain open (e.g. non-darkened circle-shaped and diamond-shaped symbols) during the test phase to detect stuck-on faults in these CIPs. The continuity through the staircase-type WUTs, as observed by the ORAs, detect stuck-off faults in the activated cross-point CIPs.

During the first staircase test phase shown in FIG. 8A, the vx1w busses are connected to the hx1n busses and the vx1e busses are connected to the hx1s busses. In the second staircase test phase shown in FIG. 8B, the vx1w busses are connected to the hx1s busses and the vx1e busses are connected to the hx1n busses. These two staircase test phases clearly form a minimum set of test phases to detect the stuck-on break-point CIP faults and the stuck-off cross-point CIP faults on the x1 busses. It is important to note that the opposite direction of the staircase in FIG. 8B where vx1w connects to hx1s and vx1e connects to vx1n is critical to avoid shorting the busses at the cross-point CIPs as would be the case if the flow of the staircase were the same as that in FIG. 8A.

As shown in FIGS. 9A–9E, test session 3 tests most of the remaining cross-point CIPs for stuck-off faults and the break-point CIPs on the direct busses for stuck-on faults. These BIST configurations utilize the same basic structure shown in FIG. 7A but various busses are interconnected utilizing cross-point CIPs as the test patterns pass from the top of the FPGA to the bottom in a zig-zag pattern instead of straight down a single bus.

The required configurations are summarized in FIGS. 9A–9E in terms of the various bus segments connected via cross-point CIPs in a PLB for the set of A WUTs (shown as bold lines) and the set of B WUTs (shown as bold dashed lines). The first four configurations are used to test the cross-point CIPs that connect the direct busses with the vx1 and hx1 busses. This set of cross-point CIPs includes a total of 12 CIPs as opposed to only 4 CIPs in the typical set of cross-point CIPs illustrated in FIG. 6.

Figure 9A:
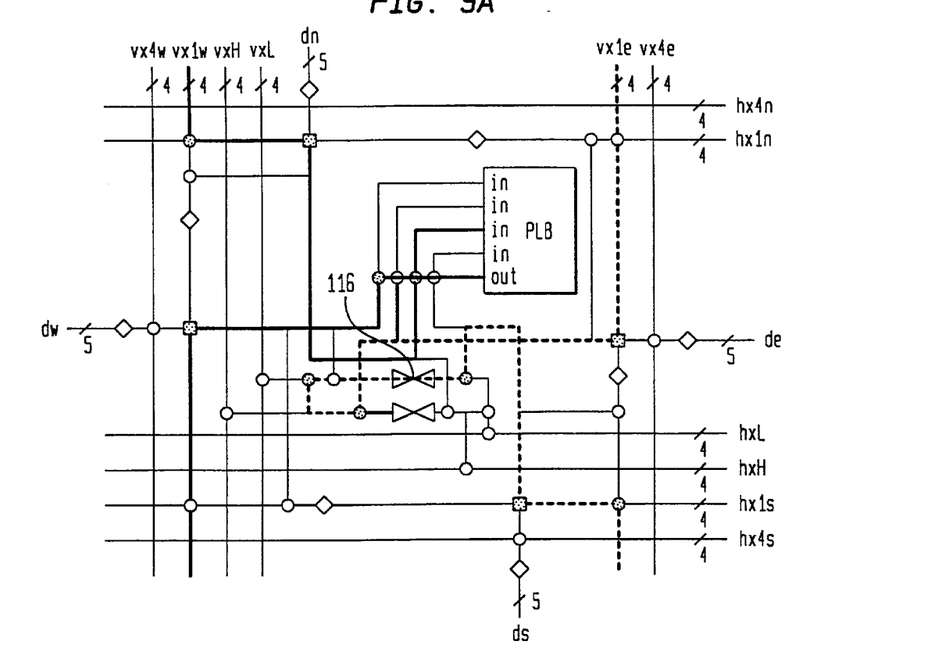
FIGS. 9A–9E are schematical illustrations of WUTs utilized for testing the remaining cross-point CIPs for stuck-off faults and the break-point CIPs on the direct busses for stuck-on faults in session 3 of the example BIST.
Figure 9B:
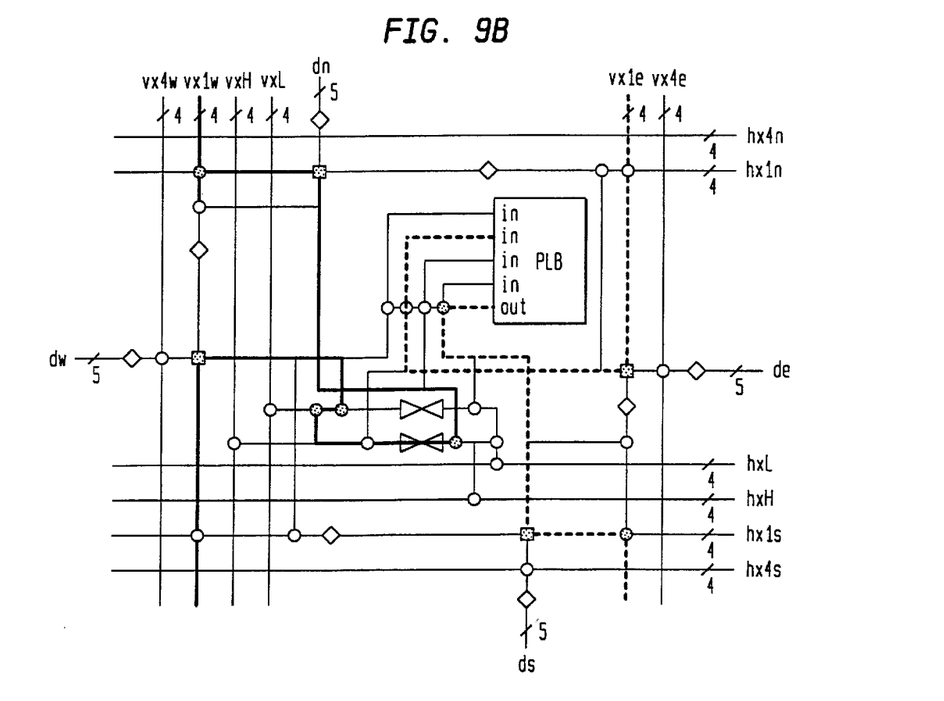
Figure 9C:
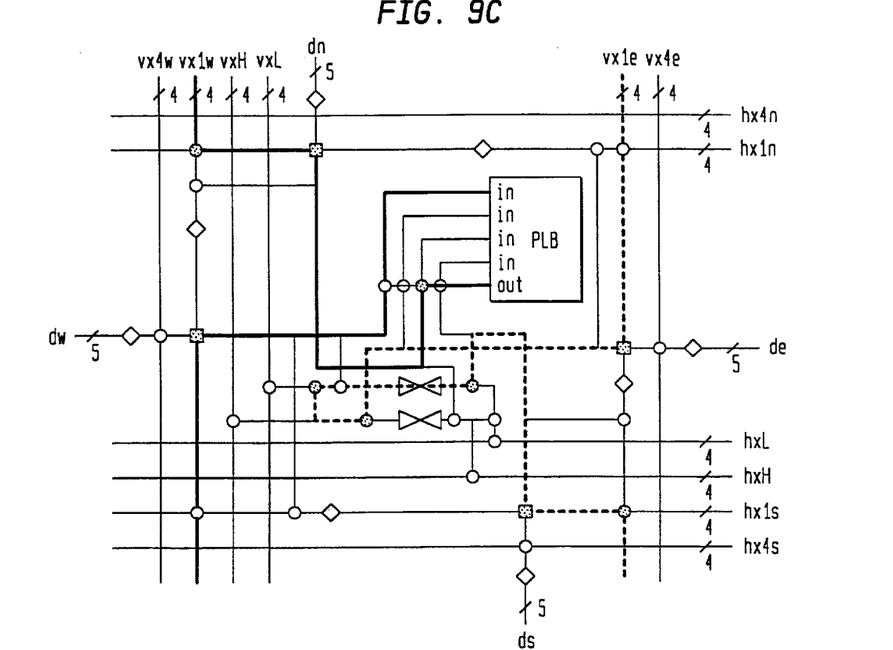
Figure 9D:
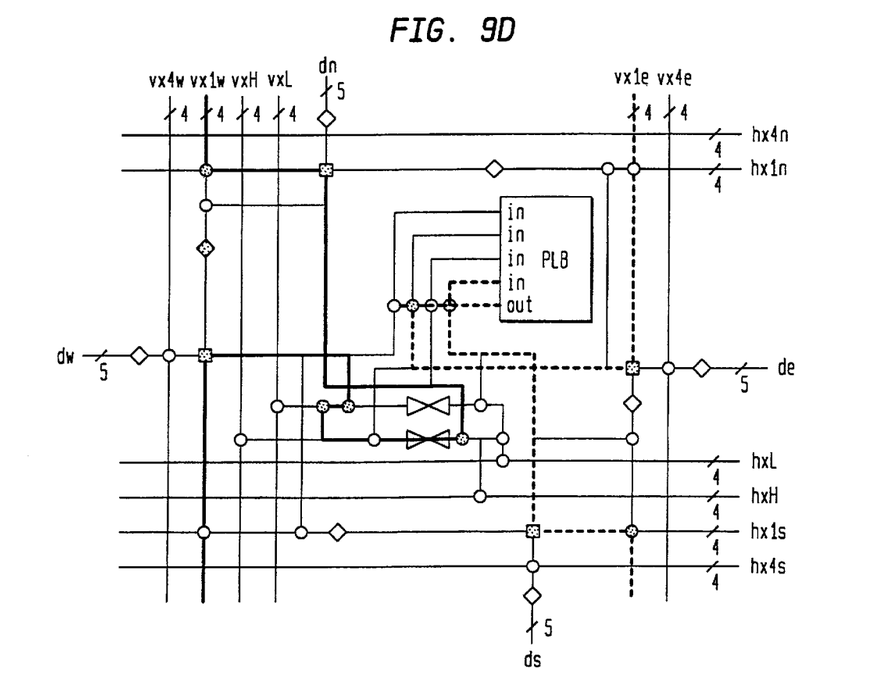
Figure 9E:
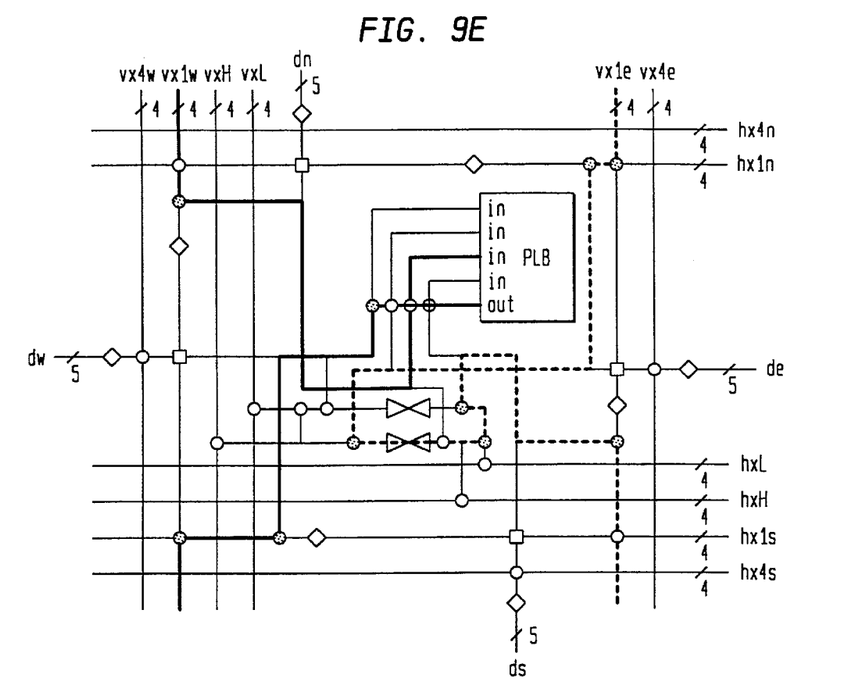
Figure 10A:
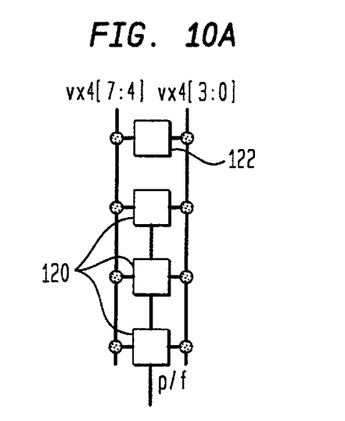
FIGS. 10A–10D are schematical illustrations of the BIST architecture for testing the direct busses and the x4 busses and the direct busses and the xH and xL busses in session 4 of the example BIST.
Figure 10B:
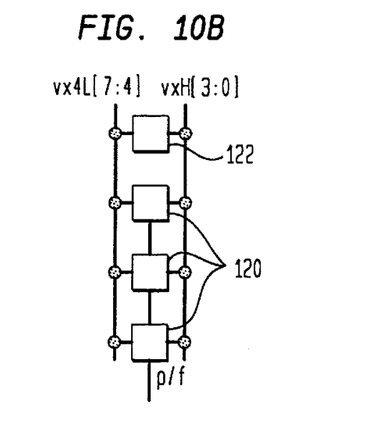
Figure 10C:
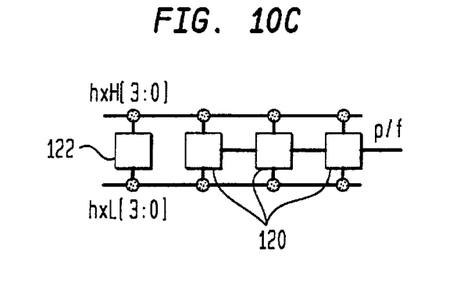
Figure 10D:
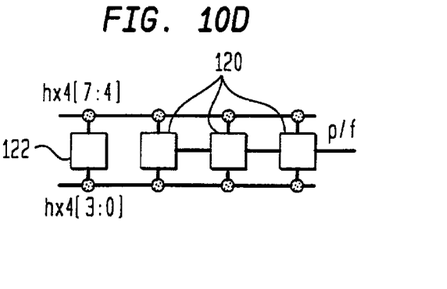

During the third and fourth configurations shown in FIGS. 9C and 9D, the BIST structure is inverted with the TPGs at the bottom of the FPGA and the ORAs and swapper cells at the top of the FPGA. These additional configurations are required to insure complete testing of the cross-point CIPs in the PLB which connect the PLB outputs to any of the four direct busses. While one set of WUTs goes through the PLB to connect the two sets of direct busses, the other set of WUTs goes through the bi-directional buffers 116 in the PLB such that these buffers are tested in both directions. Advantageously, as a result of the coverage provided by these configurations, separate rotation and re-application of the configurations in the horizontal direction are not required.

Test session 4 tests the cross-point CIPs between the direct busses and the x4 busses, as well as, between the direct busses and the xH and xL busses. The BIST structures used for these tests are shown in FIGS. 10A–10D. Because of the long spans of the x4, xH and xL busses across multiple PLBs, incremental ORAs 120 are preferred resulting in the generation of only one pass/fail or test result indication.

Test patterns generated by TPGs 122 are propagated on the busses and monitored at each PLB utilizing the incremental ORAs through the cross-point CIPs being tested. In this test session, a single 4-bit counter is utilized but the 4-bit count value is not passed to each set of busses. Instead, two bits of the 4-bit count value to each bus with each bit applied to two wires in the bus. Advantageously, the aligning step or swapper cell can be avoided at each ORA 120. Since the busses have already been tested for shorts and only stuck-off cross-point CIPs are being tested for, the fault detection capability of the test configuration is not adversely affected in this manner. Finally, the set of test configurations are rotated in order to test the cross-point CIPs for both the vertical (e.g. FIGS. 10A and 10B) and the horizontal busses (e.g. FIGS. 10C and 10D).

These four test sessions provide complete testing of the programmable interconnect network including the wire segments and their interconnecting CIPs with a total of 15 configurations. This, of course, is comparable with the number of configurations required for a complete PLB test set out in detail in pending U.S. patent applications Ser. Nos. 08/729,117 and 08/595,729. It is important to note that the number of phases does not depend on the size of the PLB array in the FPGA.

The foregoing description of a preferred embodiment of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of testing a programmable routing network of a field programmable gate array comprising the steps of:

configuring a first group of programmable logic blocks to include at least one test pattern generator and at least one output response analyzer, and a subset of said programmable routing network to include at least two groups of wires under test;

initiating a built-in self-test;

generating test patterns with said at least one test pattern generator;

comparing outputs of said at least two groups of wires under test with said at least one output response analyzer; and generating a test result indication.

2. The method set forth in claim 1, wherein the step of configuring the subset of said programmable routing network further includes utilizing a group of wire segments and a group of configurable interconnect points to form said at least two groups of wires under test.

3. The method set forth in claim 2, wherein said test patterns are exhaustive and are sufficient to detect all possible faults in said group of wire segments and said group of configurable interconnect points.

4. The method set forth in claim 3, wherein said faults include opens and shorts in said group of wires and stuck-open and stuck-closed configurable interconnect points.

5. The method set forth in claim 2, wherein the step of configuring said subset of said programmable routing network further includes establishing a second group of programmable logic blocks to pass said test patterns there through, whereby local routing networks of said programmable routing network are tested.

6. The method set forth in claim 1, further comprising the step of retrieving a built-in self-test configuration from memory and wherein the configuring step includes configuring said first group of programmable logic blocks and said subset of the programmable routing network according to said built-in-self-test configuration.

7. The method set forth in claim 6, further comprising the step of propagating said test patterns along said at least two groups of wires under test between said test pattern generator and said output response analyzer; and aligning at least one of said test patterns prior to said output response analyzer.

8. The method set forth in claim 7, wherein the aligning step further includes configuring said first group of programmable logic blocks to include a swapper cell.

9. The method set forth in claim 1, wherein the step of comparing said outputs of said at least two groups of wires under test further includes comparing the value transmitted along every output of a first group of wires under test with the value transmitted along its corresponding wire of a second neighboring group of wires under test; and comparing said values of said first group of wires under test with the values of a third neighboring group of wires under test, whereby equivalent faults in said at least two groups of wires under test are detected.

10. The method set forth in claim 1, wherein the step of generating a test result indication includes routing said test result indication of said output response analyzer to a boundary port of said field programmable gate array, whereby information regarding the location of any fault in said field programmable gate array may be obtained.

11. The method set forth in claim 1, further comprising the step of iteratively comparing a first test result indication of a first of said output response analyzers to a second test result indication of a second of said output response analyzers, whereby parallel testing of said at least two groups of wires under test is accomplished independent of the available number of boundary ports of said field programmable gate array and whereby the number of reconfigurations of said field programmable gate array and the total testing time are minimized.

12. A method of testing a field programmable gate array including programmable logic blocks and a programmable routing network comprising the steps of:

testing said programmable logic blocks;

configuring a first group of programmable logic blocks to include at least one test pattern generator and at least one output response analyzer, and a subset of said programmable routing network to include at least two groups of wires under test;

initiating a built-in self-test;

generating a first set of test patterns with said at least one test pattern generator, comparing outputs of said at least two groups of wires under test with said at least one output response analyzer; and generating a first test result indication, whereby said field programmable gate array is completely tested.

13. The method set forth in claim 12, wherein the step of testing said programmable logic blocks further comprises configuring said programmable logic blocks for completing a second built-in self-test;

initiating said second built-in self-test;

generating a second set of test patterns with said programmable logic blocks; and analyzing a resulting response with said programmable logic blocks in order to produce a second test result indication.

14. The method set forth in claim 13, wherein said configuring step includes establishing a first subset of said programmable logic blocks as test pattern generators and output response analyzers and a second subset of said programmable logic blocks as blocks under test.

15. The method set forth in claim 14, including repeatedly reconfiguring each block under test in order to test each block under test completely in all possible modes of operation.

16. The method set forth in claim 15, including reversing programming of said first and second subsets of said programmable logic blocks so that said first subset is established as blocks under test and said second subset is established as test pattern generators and output response analyzers.

17. The method set forth in claim 16, including repeatedly reconfiguring each block under test in order to test each block under test completely in all possible modes of operation following reversing programming of said first and second subsets of said programmable logic blocks.

18. An apparatus for testing a field programmable gate array including programmable logic blocks and a programmable routing network comprising:

a platform for supporting said field programmable gate array during testing;

a controller in communication with said platform for (a) loading one of a plurality of test configurations in said field programmable gate array, said configuration including at least one test pattern generator, at least two groups of wires under test for propagating test patterns, and at least one output response analyzer for comparing said test patterns propagated along said at least two groups of wires under test, (b) for initiating the built-in self-test and (c) for receiving the subsequent results of the built-in self-test; and a memory in communication with said controller for storing the plurality of test configurations and an operational field programmable gate array configuration.

19. A field programmable gate array including programmable logic blocks and a programmable routing configured to comprise:

at least one test pattern generator;

at least two groups of wires under test for propagating test patterns;

at least one output response analyzers for comparing said test patterns propagated along said at least two groups of wires under test; and whereby said programmable routing network at said field programmable gate array is tested.

20. The field programmable gate array configuration set forth in claim 19, further including memory for storing the configurations to provide exhaustive testing of each subset of said programmable routing network.

21. The field programmable gate array configuration set forth in claim 19, having no dedicated circuitry for built-in self-testing applications.

* * * * *

UNITED STATES PATENT AND TRADEMARK OFFICE
CERTIFICATE OF CORRECTION

PATENT NO.    : 6,202,182 B1
DATED         : March 13, 2001
INVENTOR(S)   : Abramovici et al.

It is certified that error appears in the above-identified patent and that said Letters Patent is hereby corrected as shown below:

Column 12,
Line 66, "routing configured" should be -- routing network configured --.

Column 13,
Line 4, "analyzers" should be -- analyzer --.
Line 7, "at said field" should be -- of said field --.

Signed and Sealed this

Twenty-ninth Day of June, 2004

JON W. DUDAS
*Acting Director of the United States Patent and Trademark Office*